United States Patent
Son et al.

(10) Patent No.: US 9,412,769 B2
(45) Date of Patent: Aug. 9, 2016

(54) TRANSISTOR, METHOD OF MANUFACTURING THE TRANSISTOR, AND ELECTRONIC DEVICE INCLUDING THE TRANSISTOR

(71) Applicant: Samsung Electronics Co., Ltd., Suwon-Si, Gyeonggi-Do (KR)

(72) Inventors: Kyoung-seok Son, Seoul (KR); Sun-jae Kim, Seoul (KR); Tae-sang Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/450,913

(22) Filed: Aug. 4, 2014

(65) Prior Publication Data

US 2015/0037955 A1   Feb. 5, 2015

(30) Foreign Application Priority Data

Aug. 5, 2013   (KR) .................. 10-2013-0092662

(51) Int. Cl.
*H01L 27/088*   (2006.01)
*H01L 27/12*   (2006.01)
*H01L 27/32*   (2006.01)
*H01L 29/786*   (2006.01)
*G02F 1/1362*   (2006.01)
*H01L 29/49*   (2006.01)

(52) U.S. Cl.
CPC ........ *H01L 27/1251* (2013.01); *G02F 1/13624* (2013.01); *G02F 1/136286* (2013.01); *H01L 27/1225* (2013.01); *H01L 27/1237* (2013.01); *H01L 27/3262* (2013.01); *H01L 29/4908* (2013.01); *H01L 29/7869* (2013.01); *H01L 29/78609* (2013.01); *H01L 27/3248* (2013.01)

(58) Field of Classification Search
None
See application file for complete search history.

(56) References Cited

U.S. PATENT DOCUMENTS 7,927,713 B2   4/2011   Ye
2012/0007158 A1*   1/2012   Yoon ................. H01L 21/28291
257/295

FOREIGN PATENT DOCUMENTS

| KR | 19940020587 A | 9/1994 |
|---|---|---|
| KR | 100711000 B1 | 4/2007 |
| KR | 20120006218 A | 1/2012 |
| KR | 20130005550 A | 1/2013 |

* cited by examiner

*Primary Examiner* — Pamela E Perkins (74) *Attorney, Agent, or Firm* — Harness, Dickey & Pierce, P.L.C.

(57) ABSTRACT

Example embodiments relate to a transistor, a method of manufacturing a transistor, and/or an electronic device including the transistor. In example embodiments, the transistor includes a first field effect transistor (FET) and a second FET connected in series to each other, wherein a first gate insulating film of the first FET and a second gate insulating film of the second FET have different leakage current characteristics or gate electric field characteristics.

34 Claims, 11 Drawing Sheets

TRANSISTOR, METHOD OF MANUFACTURING THE TRANSISTOR, AND ELECTRONIC DEVICE INCLUDING THE TRANSISTOR

CROSS-REFERENCE TO RELATED APPLICATIONS

This application claims priority under 35 U.S.C. §119 to Korean Patent Application No. 10-2013-0092662, filed on Aug. 5, 2013, in the Korean Intellectual Property Office, the disclosure of which is incorporated herein in its entirety by reference.

BACKGROUND

1. Field

Example embodiments relate to transistors, methods of manufacturing the transistors, and/or electronic devices including the transistors.

2. Description of Related Art

Transistors may be used as switching devices or driving devices in various electronic apparatuses. In particular, since thin film transistors may be manufactured on a glass substrate or a plastic substrate, thin film transistors may be used in various flat-panel display apparatuses such as liquid crystal display apparatuses and/or organic light-emitting display apparatuses.

When a transistor is used as a switching device, a voltage of a gate electrode may be controlled to two values of $V_{ON}$ and $V_{OFF}$ to provide an on current and an off current. Generally, in the case of a thin film transistor using an n-type semiconductor material as a channel layer, $V_{ON}$ has a positive value and $V_{OFF}$ has a negative value. However, a threshold voltage may change under such a voltage bias. For example, under a negative gate voltage, holes having positive charges may move toward a gate insulating film due to an electric field of a gate electrode and may be trapped near an insulating film interface, thus causing a threshold voltage decrease. The threshold voltage decrease may cause a leakage current increase under a driving voltage, and consequently may degrade a display image quality. As a result, the threshold voltage stability of the transistor used as a switching device may affect the image quality and lifetime of a display device.

SUMMARY

Example embodiments relate to transistors having an improved threshold voltage stability, methods of manufacturing the transistors, and/or electronic devices including the transistors.

Additional aspects will be set forth in part in the description which follows and, in part, will be apparent from the description, or may be learned by practice of example embodiments.

According to example embodiments, a transistor includes: a first field effect transistor (FET) including a first gate insulating film; a second FET connected in series to the first FET. The second FET includes a second gate insulating film. The first and second gate insulating films have one of different leakage current characteristics and gate electric field characteristics.

In example embodiments, the first gate insulating film may be configured to generate a larger leakage current than the second gate insulating film.

In example embodiments, an insulating property of the first gate insulating film may be lower than an insulating property of the second gate insulating film.

In example embodiments, a porosity of the first gate insulating film may be higher porosity than a porosity of the second gate insulating film.

In example embodiments, the second gate insulating film of the second FET may be configured to compensate for an off current increase due to a leakage current of the first FET.

In example embodiments, the first gate insulating film may be deposited at a lower temperature than the second gate insulating film.

In example embodiments, the first gate insulating film may be configured to provide a lower gate electric field than the second gate insulating film.

In example embodiments, a gate capacitance of the first FET may be lower than a gate capacitance of the second FET.

In example embodiments, a thickness of the first gate insulating film may be thicker than a thickness of the second gate insulating film.

In example embodiments, a dielectric constant of the first gate insulating film may be lower than a dielectric constant of the second gate insulating film.

In example embodiments, the second gate insulating film of the second FET may be configured to compensate for a subthreshold slope decrease due to the first gate insulating film.

In example embodiments, the first FET and the second FET may share one channel layer.

In example embodiments, one of the first FET and the second FET may have a top gate structure, and the other may have a bottom gate structure.

According to example embodiments, a transistor includes: a bottom gate electrode; an insulating layer covering the bottom gate electrode; a channel layer on the insulating layer; a protection layer on the channel layer, the protection layer patterned to expose a plurality of regions spaced apart from each other on the channel layer; a drain electrode and a source electrode respectively contacting both end regions among the plurality of regions of the channel layer; an intermediate electrode contacting an intermediate region among the plurality of regions of the channel layer; and a top gate electrode on the protection layer between the drain electrode and the intermediate electrode. The insulating layer and the protection layer respectively function as gate insulating films having one of different leakage current characteristics and gate electric field characteristics with respect to the bottom gate electrode and the top gate electrode.

In example embodiments, an insulating property of the protection layer may be lower than an insulating property of the insulating layer.

In example embodiments, the protection layer may include: a first protection layer contacting the channel layer; and a second protection layer covering the first protection layer, the source electrode, the intermediate electrode, and the drain electrode.

In example embodiments, a thickness of the protection layer may be thicker than a thickness of the insulating layer.

In example embodiments, a dielectric constant of the protection layer may be lower than a dielectric constant of the insulating layer.

In example embodiments, the channel layer may include one of amorphous silicon, crystalline silicon, semiconductor oxide, and semiconductor nitride.

In example embodiments, the semiconductor oxide may include at least one of $In_2O_3$, $Ga_2O_3$, ZnO, $TiO_2$, $Ta_2O_3$, $ZrO_2$, $HfO_2$, and $SnO_2$.

In example embodiments, the semiconductor nitride may include one of $Zn_3N_2$-containing ZnON, ZnONF, Ga—ZnON, In—ZnON, Al—ZnON, Ga—ZnONF, In—ZnONF, and Al—ZnONF.

In example embodiments, the top gate electrode may include a transparent electrode material.

According to example embodiments, an electronic device may include any one of the above-described transistors.

The electronic device may be a display device that uses the transistor as a driving device or a switching device.

According to example embodiments, an organic light-emitting display device includes: any one of the above-described transistors; a pixel electrode connected to the drain electrode of the transistor; a common electrode spaced apart from the pixel electrode; and an organic emission layer disposed between the pixel electrode and the common electrode.

According to example embodiments, a liquid crystal display device includes: any one of the above-described transistors; a pixel electrode connected to the drain electrode of the transistor; a common electrode spaced apart from the pixel electrode; and a liquid crystal layer between the pixel electrode and the common electrode.

According to example embodiments, a method of manufacturing a transistor includes: forming a bottom gate electrode on a substrate; forming an insulating layer covering the bottom gate electrode; forming a channel layer on the insulating layer; forming a protection layer on the channel layer, the protection layer being patterned to expose a plurality of regions spaced apart from each other on the channel layer, the protection layer being formed under different deposition conditions than the insulating layer, and the protection layer and the insulating layer having different leakage current characteristics; forming a drain electrode, an intermediate electrode, and a source electrode respectively contacting the plurality of regions; and forming a top gate electrode on the protection layer between the drain electrode and the intermediate electrode.

In example embodiments, the forming of the protection layer may include: forming a first protection layer contacting the channel layer; and forming a second protection layer to cover the first protection layer, the source electrode, the intermediate electrode, and the drain electrode.

In example embodiments, the protection layer may be formed at a lower deposition temperature than a deposition temperature for forming the insulating layer.

In example embodiments, the forming the insulating layer may including forming the insulating layer at a deposition temperature of about 200° C. to about 500° C.

In example embodiments, the forming the protection layer may include forming the protection layer a deposition temperature of about 150° C. to about 400° C.

In example embodiments, the top gate electrode may be formed from a transparent electrode material.

According to example embodiments, a transistor includes: a first gate electrode; a first insulating layer on the first gate electrode; a channel layer on the first insulating layer; a source electrode, an intermediate electrode, and a drain electrode spaced apart from each other on the channel layer; a protection layer on the channel layer; and a second gate electrode. The protection layer includes a first portion between the source electrode and the intermediate electrode and a second portion between the intermediate electrode and the source electrode. The second portion of the protection layer may be over the first gate electrode. The protection layer and the first insulating layer have one of different leakage current characteristics and different gate electric field characteristics. The second gate electrode is on the first portion of the protection layer.

In example embodiments, a material of the protection layer may be the same as a material of the first insulating layer, and a thickness of a part of the protection layer between the channel layer and the second gate electrode may be greater than a thickness of a part of the first insulating layer between the first gate electrode and the channel layer.

In example embodiments, a porosity of the protection layer may be higher than a porosity of the first insulating layer.

In example embodiments, the channel layer may include one of amorphous silicon, crystalline silicon, semiconductor oxide, and semiconductor nitride.

In example embodiments, a dielectric constant of the protection layer is lower than a dielectric constant of the first insulating layer.

BRIEF DESCRIPTION OF THE DRAWINGS

These and/or other aspects will become apparent and more readily appreciated from the following description of non-limiting embodiments, taken in conjunction with the accompanying drawings in which like reference characters refer to like parts throughout the different views. The drawings are not necessarily to scale, emphasis instead being placed upon illustrating the principles of inventive concepts. In the drawings.

DETAILED DESCRIPTION

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
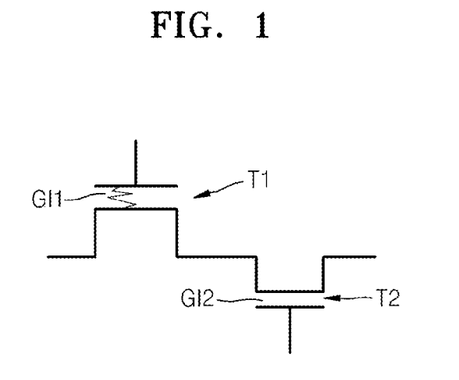
FIG. 1 is an equivalent circuit diagram illustrating a transistor structure according to example embodiments.
Figure 2:
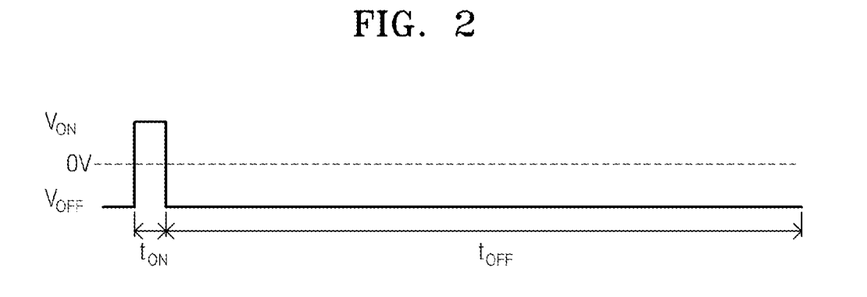
FIG. 2 is a graph illustrating the relationship between a gate voltage and an application time when a transistor is used as a switching device.

FIG. 1 is an equivalent circuit diagram illustrating a transistor structure according to example embodiments. FIG. 2 is a graph illustrating the relationship between a gate voltage and an application time when a transistor is used as a switching device.

A transistor structure according to example embodiments may have a structure in which two field effect transistors (FETs) are connected in series to each other. As illustrated in FIG. 1, a first FET T1 and a second FET T2 are connected in series to each other, and are configured to have different gate insulating film characteristics. A first gate insulating film GI1 of the first FET T1 and a second gate insulating film GI2 of the second FET T2 are configured to have different leakage current or gate electric field characteristics.

In example embodiments, the transistor structure is configured to reduce a threshold voltage instability.

For example, when the transistor is used as a switching device, a desired (and/or alternatively predetermined) bias voltage is applied to a gate electrode, which may cause a threshold voltage instability. The switching device functions to control an on/off of drain-source current by changing a voltage of the gate electrode as illustrated in FIG. 2.

In general, amorphous silicon, semiconductor oxide, or semiconductor nitride such as ZnON use an n-type semiconductor using electrons as a current carrier, and a polysilicon thin-film transistor uses a p-type semiconductor using holes as a carrier for the purpose of process simplification. FIG. 2 illustrates applied voltage characteristics in the case of using an n-type semiconductor. As illustrated in FIG. 2, an on-state gate voltage $V_{ON}$ has a positive value and an off-state gate voltage $V_{OFF}$ has a negative value. Under a negative gate voltage, holes having positive charges move from a semiconductor forming a channel toward a gate insulating film and are trapped by an interface trap site at an insulating film interface. On the other hand, under a positive gate voltage, electrons move toward the gate insulating film and are trapped near an insulating film interface. A trap of the hole, which is a positive charge, decreases the threshold voltage, while a trap of the electron, which is a negative charge, increases the threshold voltage. When the switching device is driven, times for applying on/off voltages, that is, a $V_{ON}$ application time $t_{ON}$ and a $V_{OFF}$ application time $t_{OFF}$ in FIG. 2 are not equal to each other. Therefore, when the switching device is driven for a desired (and/or alternatively predetermined) time, the threshold voltage shifts in a desired (and/or alternatively predetermined) direction due to the density and characteristics of an interface trap involved in the trapping. In detail, in the case of a ZnON-based thin-film transistor, a threshold voltage decrease due to application of a negative gate voltage is remarkable. This may be verified through a direct current (DC) bias stress evaluation test. Also, in the case of a general switching device, since a capacitor is charged for a short time $t_{ON}$ and a charged voltage is maintained for a desired (and/or alternatively predetermined) time, $t_{OFF}$ is longer than $t_{ON}$. Therefore, a threshold voltage change is remarkable under a negative voltage than under a positive voltage.

According to example embodiments, the transistor structure includes the first FET T1 that directly contributes to decrease a threshold voltage change, and the second FET T2 that is to compensate for a resultant characteristic degradation, such as an off current increase or a subthreshold slope decrease.

In order to decrease a threshold voltage change, the first FET T1 is formed to generate a larger leakage current than in a general case. To this end, the first gate insulating film GI1 may be configured to have a lower insulating property than the second gate insulating film GI2. For example, the first gate insulating film GI1 may be formed to have a higher porosity than the second gate insulating film GI2. As will be described later in a manufacturing method according to example embodiments, this property may be controlled by controlling a deposition condition in an insulating film manufacturing process.

The second FET T2 may function to compensate for an off current increase due to a leakage current of the first FET T1, and the second gate insulating film GI2 includes a higher-quality insulating film than the first gate insulating film GI1.

Alternatively, in order to decrease a threshold voltage change, the first gate insulating film GI1 may be configured to provide a lower gate electric field than the first insulating film GI2. For example, the first FET T1 may have a lower gate capacitance than the second FET T2. To this end, the first gate insulating film GI1 may be thicker than the second gate insulating film GI2, or the first gate insulating film GI1 may have a lower dielectric constant than the second gate insulating film GI2.

The second gate insulating film GI2 of the second FET T2 may be configured to compensate for a subthreshold slope decrease due to the first gate insulating film GI1.

Examples for implementing inventive concepts will be described below with reference to a detailed structure.

Figure 3:
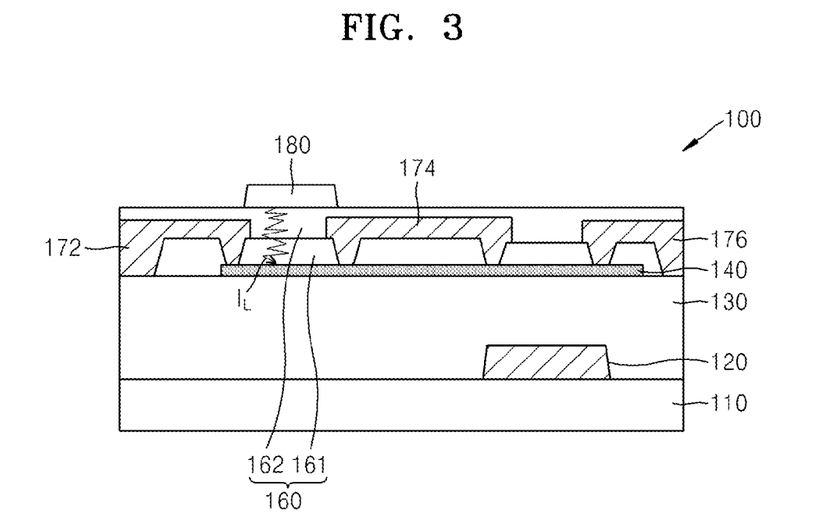
FIG. 3 is a cross-sectional view illustrating a schematic structure of a transistor according to example embodiments.

FIG. 3 is a cross-sectional view illustrating a schematic structure of a transistor 100 according to example embodiments.

The transistor 100 includes: a bottom gate electrode 120 formed on a substrate 110; an insulating layer 130 covering the bottom gate electrode 120; a channel layer 140 formed on the insulating layer 130; a protection layer 160 formed on the channel layer 140 and patterned to expose a plurality of regions spaced apart from each other on the channel layer 140; a drain electrode 172 and a source electrode 176 respectively contacting both end regions among the plurality of regions; an intermediate electrode 174 contacting an intermediate region among the plurality of regions; and a top gate electrode 180 formed on the protection layer 160 between the drain electrode 172 and the intermediate electrode 174.

The insulating layer 130 and the protection layer 160 are configured to respectively function as gate insulating films having different leakage current characteristics with respect to the bottom gate electrode 120 and the top gate electrode 180. That is, the top gate electrode 180, the protection layer 160, the drain electrode 172, the intermediate electrode 174, and the channel layer 140 constitute the first FET T1; and the bottom gate electrode 120, the insulating layer 130, the channel layer 140, the intermediate electrode 174, and the source electrode 176 constitute the second FET T2. The first FET T1 and the second FET T2 share regions of one channel layer 140, but are not limited thereto.

The substrate 110 may be a glass substrate or a transparent plastic substrate, but is not limited thereto.

The bottom gate electrode 120 may include a high-conductivity metal material, such as platinum (Pt), ruthenium (Ru), gold (Au), silver (Ag), molybdenum (Mo), aluminum (Al), tungsten (W), or copper (Cu).

The insulating layer 130 may include an insulting material, such as silicon oxide or silicon nitride. For example, the insulating layer 130 may include $SiO_2$, $HfO_2$, $Al_2O_3$, $Si_3N_4$, or any mixture thereof.

The channel layer 140 may include a semiconductor material, such as amorphous silicon, crystalline silicon, semiconductor oxide, or semiconductor nitride. The semiconductor oxide may include at least one of $In_2O_3$, $Ga_2O_3$, ZnO, $TiO_2$, $Ta_2O_3$, $ZrO_2$, $HfO_2$, and $SnO_2$. The semiconductor nitride may include $Zn_3N_2$-containing ZnON, ZnONF, Ga—ZnON, In—ZnON, Al—ZnON, Ga—ZnONF, In—ZnONF, or Al—ZnONF.

The protection layer 160 may include: a first protection layer 161 contacting the channel layer 140; and a second protection layer 162 formed to cover the first protection layer 161, the source electrode 176, the intermediate electrode 174, and the drain electrode 172.

The first protection layer 161 functions as an etch stop layer. For example, when a metal layer is etched to form a source electrode and a drain electrode, the first protection layer 161 protects the channel layer 140. The first protection layer 161 is formed to have a lower insulating property than the insulating layer 130. Also, in order to reduce (and/or minimize) an influence on a semiconductor serving as a channel, the first protection layer 161 used as an etch stop layer may be deposited at a lower temperature than a general insulating film. That is, even when the first protection layer 161 and the insulating layer 130 are formed of the same material, the first protection layer 161 may have a lower insulating property than the insulating layer 130 by varying a process condition, for example, a deposition temperature. Alternatively, the first protection layer 161 may include a different material that has a lower insulating property than the material of the insulating layer 130.

The second protection layer 162 is formed to cover the drain electrode 172, the source electrode 176, and the intermediate electrode 174, and is formed to have a lower insulating property than the insulating layer 130. In order to reduce (and/or minimize) an influence on the channel layer 140, the second protection layer 162 is also formed at a low temperature of less than about 300° C. at a high deposition rate. Therefore, the second protection layer 162 has a lower insulating property than the insulating layer 130. That is, even when the second protection layer 162 and the insulating layer 130 are formed of the same material, the second protection layer 162 may have a lower insulating property than the insulating layer 130 by varying a process condition, for example, a deposition temperature. Alternatively, the second protection layer 162 may include a different material (for example, an organic insulating material) that has a lower insulating property than the material of the insulating layer 130.

The top gate electrode 180 may include a high-conductivity metal material, such as Pt, Ru, Au, Ag, Mo, Al, W, or Cu. Alternatively, when the top gate electrode 180 is applied, for example, to a display device, the top gate electrode 180 may be manufactured simultaneously in a pixel electrode forming process. In this case, like the pixel electrode, the top gate electrode 180 may include a transparent electrode material. For example, the top gate electrode 180 may include transparent conductive oxide (TCO). In detail, the top gate electrode 180 may include indium tin oxide (ITO), indium zinc oxide (IZO), aluminum zinc oxide (AZO), ZnO, GZO(ZnO: Ga), $In_2O_3$, $SnO_2$, CdO, $CdSnO_4$, or $Ga_2O_3$.

Figure 4:
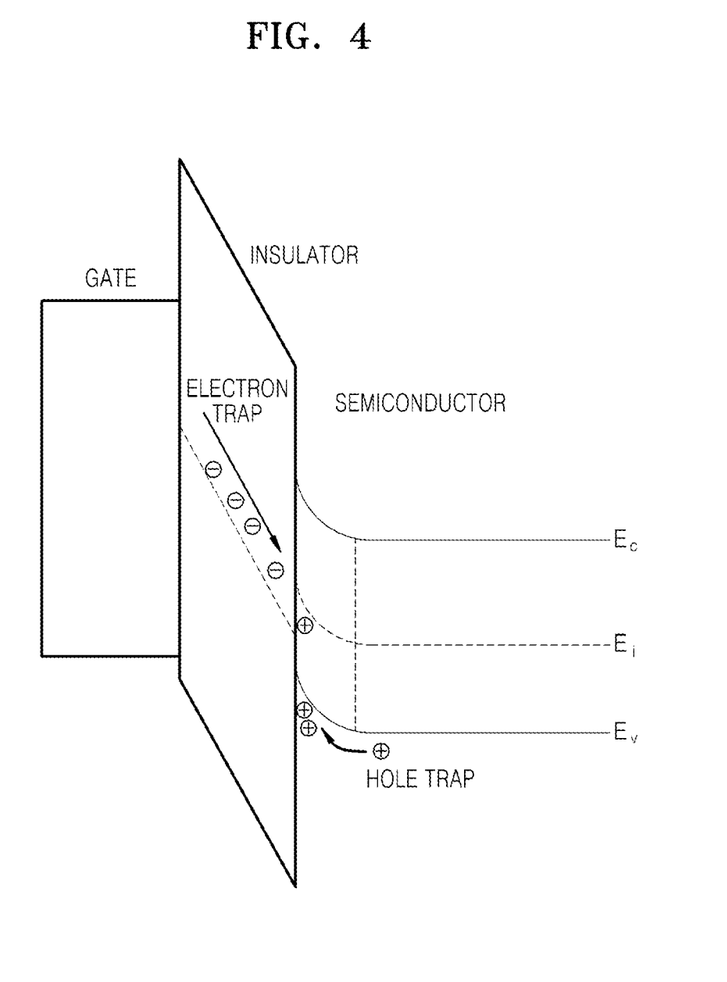
FIG. 4 is a conceptual diagram illustrating a principle in which a threshold voltage change decreases in a transistor according to example embodiments.

FIG. 4 is a conceptual diagram illustrating a principle in which a threshold voltage change decreases in a transistor 100 according to example embodiments.

FIG. 4 is based on the assumption that a negative voltage is applied to a gate electrode, and holes, which are positive charges, are moved by a gate voltage from a channel including a semiconductor material toward an insulating film and are trapped at an insulating film interface. Also, due to the gate insulating film characteristics according to example embodiments, a gate leakage current may be generated, that is, electrons are moved from the gate electrode through the insulating film. Then, the electrons are trapped at the insulating film interface. That is, since the total quantity of charges trapped at the insulating film interface decreases in comparison with the quantity of charges trapped from the channel, a threshold voltage change decreases. This phenomenon may also be described as that, since the charges trapped near the insulating film interface induce a threshold voltage shift in opposite directions, a threshold voltage decreases.

FIG. 4 illustrates the case of applying a negative gate voltage. However, a threshold voltage instability may also be reduced on a similar principle even in the case of applying a positive gate voltage. That is, when a positive gate voltage is applied, electrons are moved from the channel toward the insulating film and are trapped at the insulating film interface, and holes, which are positive charges, are moved from the gate electrode through the insulating film in the direction of a leakage current. Since the total quantity of charges trapped at the insulating film interface decreases in comparison with the quantity of charges moved from the channel, a threshold voltage change decreases, that is, a threshold voltage instability is reduced.

Figure 5:
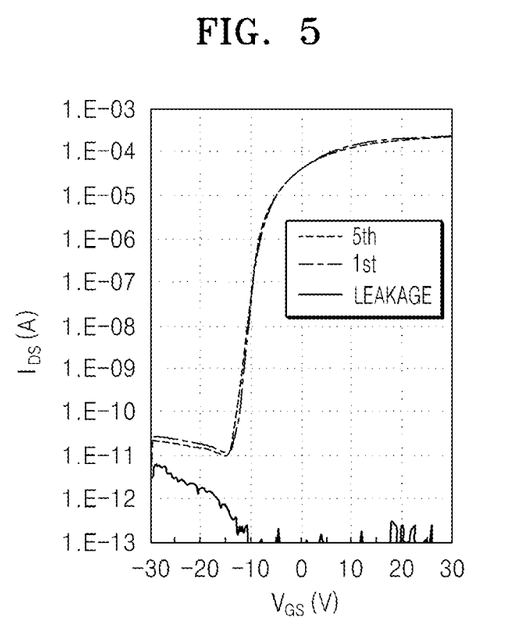
FIG. 5 is a graph illustrating a threshold voltage change when a first field effect transistor (FET) is repeatedly measured in a transistor according to example embodiments.
Figure 6:
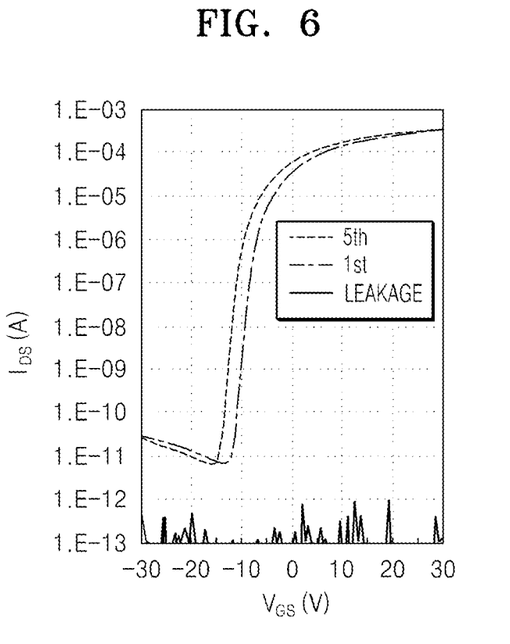
FIG. 6 is a graph illustrating a threshold voltage change when a second FET is repeatedly measured in a transistor according to example embodiments.

FIG. 5 is a graph illustrating a threshold voltage change when the first FET T1 is repeatedly measured in the transistor 100 according to example embodiments. FIG. 6 is a graph illustrating a threshold voltage change when the second FET T2 is repeatedly measured in the transistor 100 according to example embodiments. The graphs illustrate the cases of first measurement and fifth measurement.

In FIG. 5, the gate insulating film GI1 of the first FET T1 was formed of $SiO_2$ at a deposition temperature of about 250° C., and the gate insulating film GI2 of the second FET T2 was formed of $SiO_2$ at a deposition temperature of about 350° C.

As described above, the first FET T1 is configured to generate a gate leakage current, and a threshold voltage change rarely occurs under repeated measurement. On the other hand, the second FET T2 is configured to have a very small gate leakage current by using a high-quality insulating film, and a threshold voltage change greatly occurs under repeated measurement. In the case of the first FET T1 having a large gate leakage current, an off current level is high.

Figure 7:
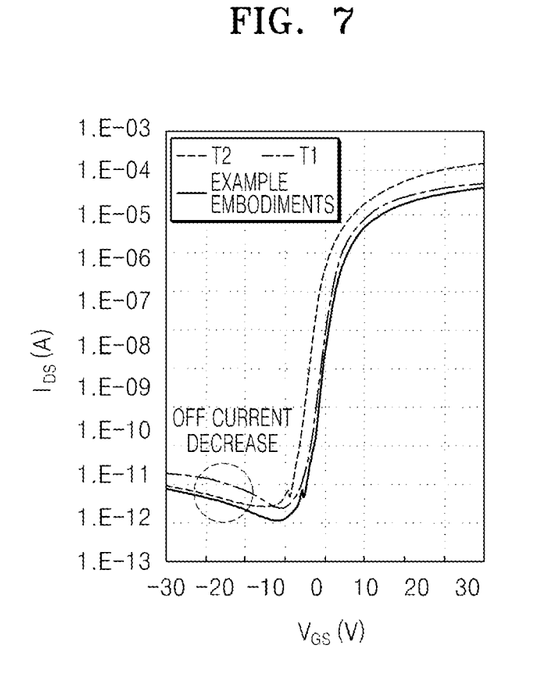
FIG. 7 is a graph illustrating that a transistor according to example embodiments has a small off current in comparison with a first FET and a second FET.

FIG. 7 is a graph illustrating that the transistor 100 according to example embodiments has a small off current in comparison with the first FET T1 and the second FET T2.

In example embodiments, the transistor 100, in which the first FET T1 and the second FET T2 are connected in series to each other and the same gate voltage is simultaneously applied thereto, has an off current that is lower than an off current of the first FET T1 and the second FET T2.

Figure 8:
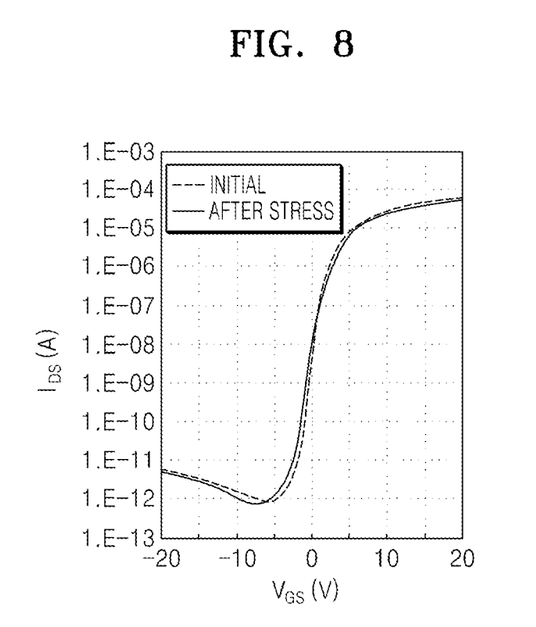
FIG. 8 is a graph illustrating that a transistor according to example embodiments has a small threshold voltage change under a stress.
Figure 9:
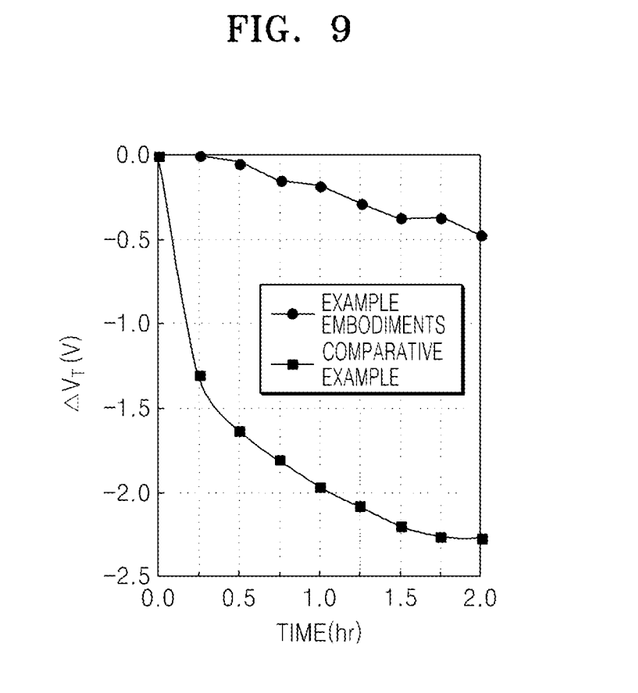
FIG. 9 is a graph illustrating a comparison between a threshold voltage change of a transistor according to example embodiments under a stress and that of a comparative example.

FIG. 8 is a graph illustrating that a transistor 100 according to example embodiments has a small threshold voltage change under a stress. FIG. 9 is a graph illustrating a comparison between a threshold voltage change of a transistor according to example embodiments under a stress and that of a comparative example.

Herein, as a stress condition, a voltage of about −20 V is applied to the gate electrode, a voltage of about 0 V is applied to the source electrode and the drain electrode, and a temperature is set to about 60° C.

In FIG. 9, the comparative example corresponds to a transistor that uses a high-quality insulating film as a gate insulating film.

Referring to the graphs, the transistor 100 according to example embodiments has a threshold voltage change $\Delta V_T$ of about −0.5 V that is much smaller than about −2.3 V of the comparative example.

Figure 10:
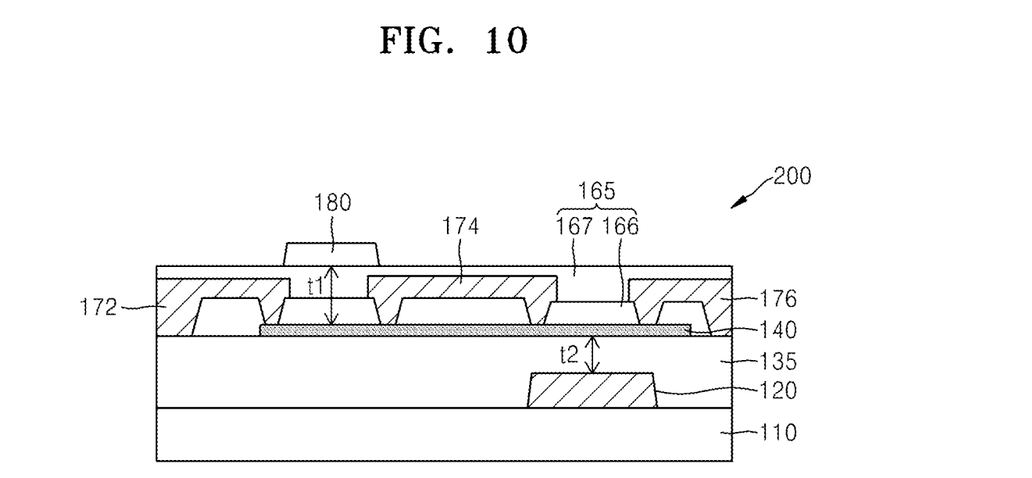
FIG. 10 is a cross-sectional view illustrating a schematic structure of a transistor according to example embodiments.
Figure 11:
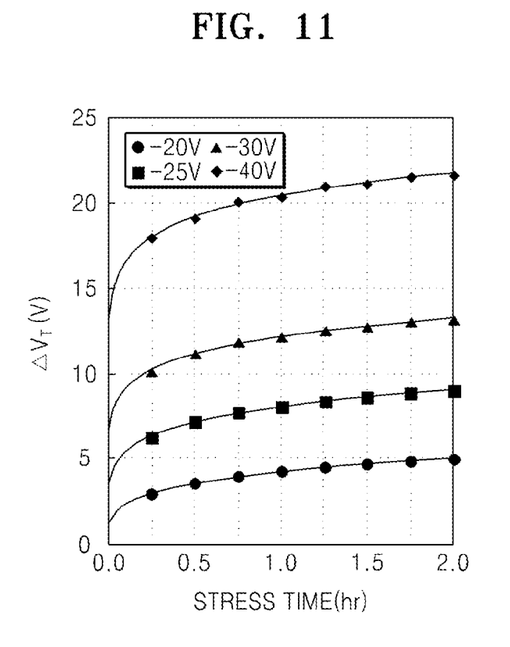
FIG. 11 is a graph illustrating that a threshold voltage change decreases as a gate electric field decreases.

FIG. 10 is a cross-sectional view illustrating a schematic structure of a transistor 200 according to example embodiments. FIG. 11 is a graph illustrating that a threshold voltage change decreases as a gate electric field decreases.

According to example embodiments, the transistor 200 is configured such that a gate insulating film of a first FET T1 is formed to have a lower gate electric field than a gate insulating film of a second FET T2.

Theoretically and experimentally, a threshold voltage change is expected to decrease as the gate electric field decreases.

The graph of FIG. 11 represents a threshold voltage change $\Delta V_T$ with time for gate voltages of −20 V, −25 V, −30 V, and −40 V, and represents that the threshold voltage change $\Delta V_T$ decreases as a gate voltage level decreases, that is, as the gate electric field decreases.

Table 1 below numerically represents a threshold voltage change depending on a gate electric field under a stress temperature.

TABLE 1

| Gate Electric Field [MV/cm] | 60° C. | 80° C. | 100° C. |
|---|---|---|---|
| 0.25 | 0.9 | 1.1 | 0.9 |
| 0.5 | 4.8 | 5 | 5.4 |
| 0.63 | 8.7 | 9 | 9.3 |
| 0.75 | 12.7 | 13.1 | 13.7 |
| 1 |  | 21.6 |  |

Referring to Table 1, as the gate electric field decreases, a threshold voltage change at each temperature decreases and a temperature-dependent change decreases.

The gate electric field may be represented as gate capacitance characteristics. That is, a gate capacitance decreases as the thickness of the gate insulating film increases, or as the dielectric constant thereof decreases.

Therefore, in the transistor 200, a thickness t1 of a protection layer 165 functioning as a gate insulating film for a top gate electrode 180 may be larger than a thickness t2 of an insulating layer 135 functioning as a gate insulating film for a bottom gate electrode 120. The protection layer 165 may include a first protection layer 166 and a second protection layer 167 according to a manufacturing process. The thickness t1 of the protection layer 165 may be about 50 nm to about 5 µm, and the thickness t2 of the insulating layer 135 may be about 100 nm to about 1 µm.

Also, the protection layer 165 may be formed to have a lower dielectric constant than the insulating layer 135. For example, the protection layer 165 may be formed of an organic insulating film, and the insulating layer 135 may be formed of an inorganic insulating film. Alternatively, the protection layer 165 may be formed of a silicon oxide film, and the insulating layer 135 may be formed of a silicon nitride film.

In example embodiments, the protection layer 165 of the first FET T1 is formed to a large thickness to promote a threshold voltage stability. However, a subthreshold slope decrease and a threshold voltage decrease occur when the thickness of the protection layer 165 increases. This is compensated for by the second FET T2. To this end, the thickness t2 of the insulating layer 135 may be suitably set to be smaller than the thickness t1 of the protection layer 165.

FIGS. 12A to 12I are cross-sectional views illustrating a method of manufacturing a transistor 100 according to example embodiments.

Figure 12A:
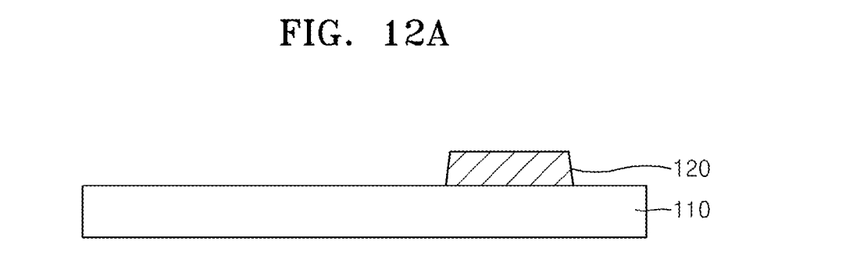
FIGS. 12A to 12I are cross-sectional views illustrating a method of manufacturing a transistor according to example embodiments.

Referring to FIG. 12A, a bottom gate electrode 120 is formed on a substrate 110.

The substrate 110 may be a glass substrate or a transparent plastic substrate, but is not limited thereto. For example, the substrate 110 may be a polymer substrate or a flexible substrate.

The bottom gate electrode 120 may include a high-conductivity metal material, such as Pt, Ru, Au, Ag, Mo, Al, W, or Cu, and may be formed by plating or deposition.

Figure 12B:
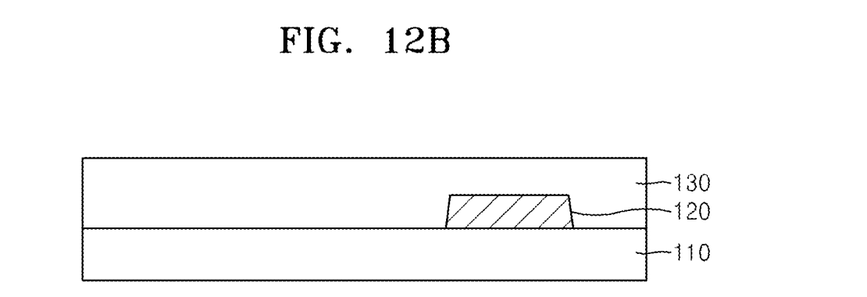

Referring to FIG. 12B, an insulating layer 130 is formed to cover the bottom gate electrode 120.

The insulating layer 130 may include silicon oxide or silicon nitride. For example, the insulating layer 130 may be formed by deposition $SiO_2$, $HfO_2$, $Al_2O_3$, $Si_3N_4$, or any mixture thereof. The insulating layer 130 may be formed by chemical vapor deposition and/or a physical vapor deposition method, such as sputtering or evaporation. The insulating layer 130 may be formed to have an insulation quality suitable for a gate insulating film, and may be deposited at a temperature of about 200° C. to about 500° C. However, example embodiments are not limited thereto.

Figure 12C:
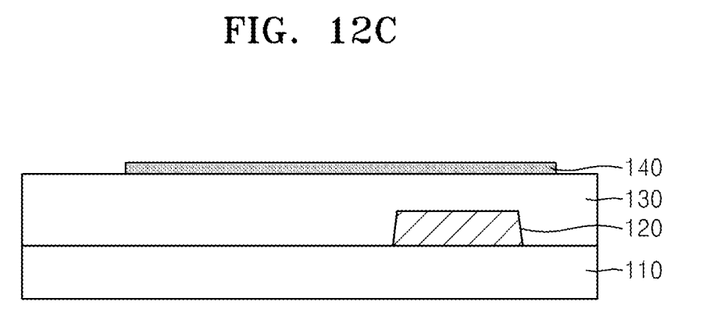

Referring to FIG. 12C, a channel layer 140 is formed on the insulating layer 130.

The channel layer 140 may include a semiconductor material, such as amorphous silicon, crystalline silicon, semiconductor oxide, or semiconductor nitride. The semiconductor oxide may include at least one of $In_2O_3$, $Ga_2O_3$, ZnO, $TiO_2$, $Ta_2O_3$, $ZrO_2$, $HfO_2$, and $SnO_2$. The semiconductor nitride may include $Zn_3N_2$-containing ZnON, ZnONF, Ga—ZnON, In—ZnON, Al—ZnON, Ga—ZnONF, In—ZnONF, or Al—ZnONF.

Figure 12D:
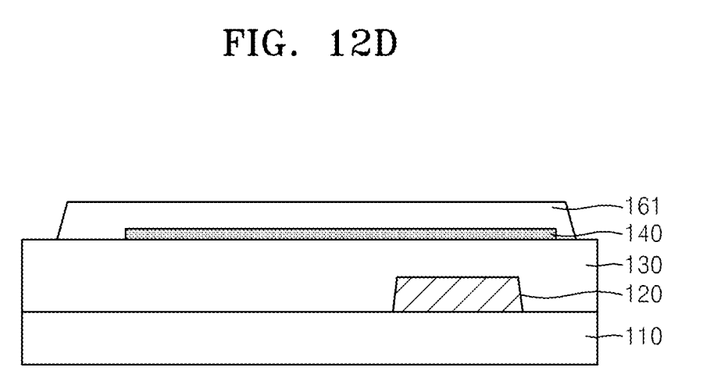
Figure 12E:
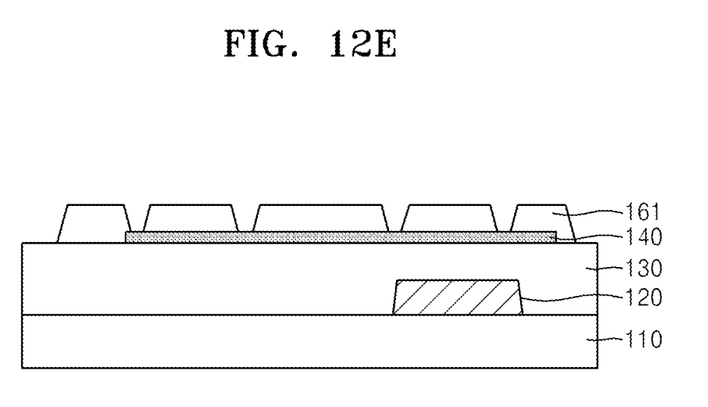

Referring to FIG. 12D, a first protection layer 161 is formed to cover the channel layer 140. Referring to FIG. 12E, the first protection layer 161 is patterned to open some regions on the channel layer 140. In FIG. 12E, four opened regions are illustrated. However, this is merely a non-limiting example, and three regions to contact a drain electrode, an intermediate electrode, and a source electrode may be opened.

The first protection layer 161 may function as an etch stop layer. For example, when a metal layer is etched to form a source electrode and a drain electrode, the first protection layer 161 protects the channel layer 140. The first protection layer 161 may be formed to have a lower insulating property than the insulating layer 130, or may be formed to have a porosity. Also, in order to reduce (and/or minimize) an influence on a semiconductor serving as a channel, the first protection layer 161 used as an etch stop layer is deposited at a lower temperature than a general insulating film. In detail, the first protection layer 161 may be deposited at a lower temperature than the insulating layer 130. For example, the first protection layer 161 may be deposited at a temperature of about 150° C. to about 300° C. In general, a deposition condition of a low plasma density may be used to obtain a porous thin film, and a porosity degree may be changed by controlling an electrode interval, a temperature, a pressure, a flow rate, and power in a deposition equipment.

Figure 12F:
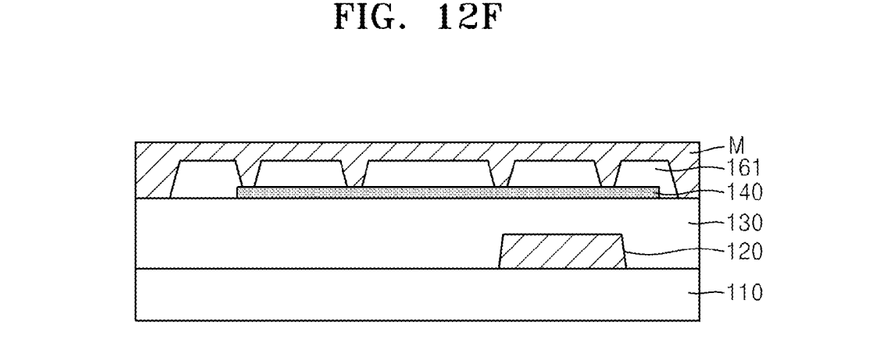

Referring to FIG. 12F, a metal layer M is formed. The metal layer M may include a high-conductivity metal material, such as Pt, Ru, Au, Ag, Mo, Al, W, or Cu, and combinations thereof may be formed by plating or deposition.

Figure 12G:
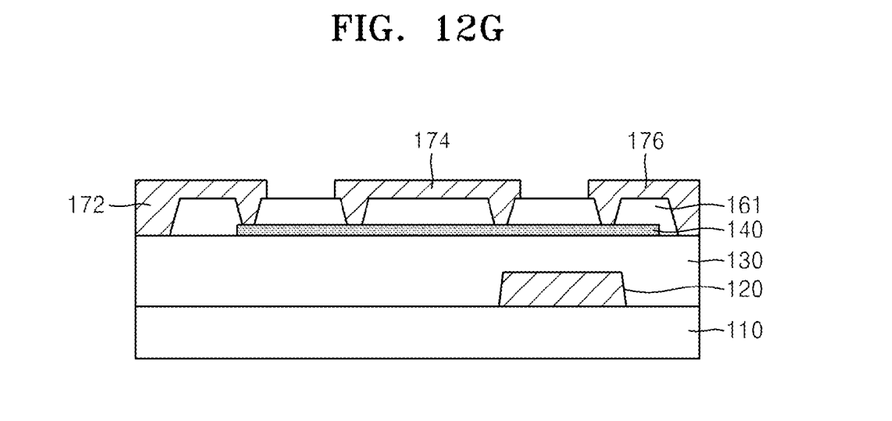

Referring to FIG. 12G, the metal layer M is patterned into a drain electrode 172, a source electrode 176, and an intermediate electrode 174.

Figure 12H:
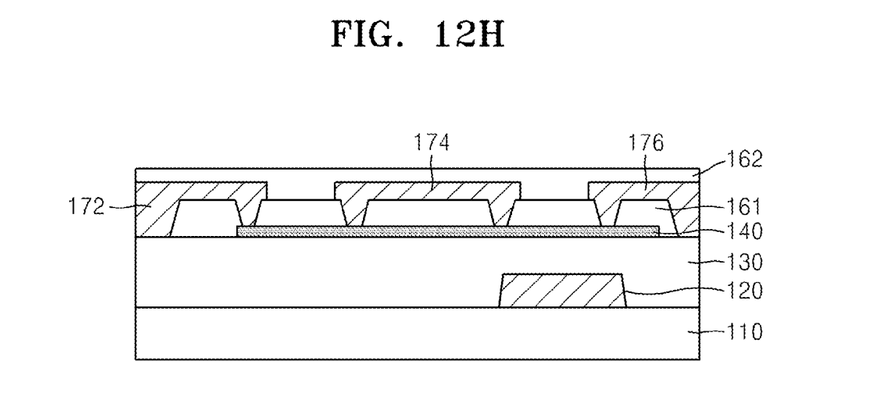

Referring to FIG. 12H, a second protection layer 162 is formed. The second protection layer 162 is formed to cover the drain electrode 172, the source electrode 176, and the intermediate electrode 174, and is formed to have a lower insulating property than the insulating layer 130. In order to reduce (and/or minimize) an influence on the channel layer 140, the second protection layer 162 is also formed at a low temperature of less than about 300° C. at a high deposition rate. Therefore, the second protection layer 162 has a lower insulating property than the insulating layer 130. The second protection layer 162 may be deposited at a temperature of about 150° C. to about 400° C.

Figure 12I:
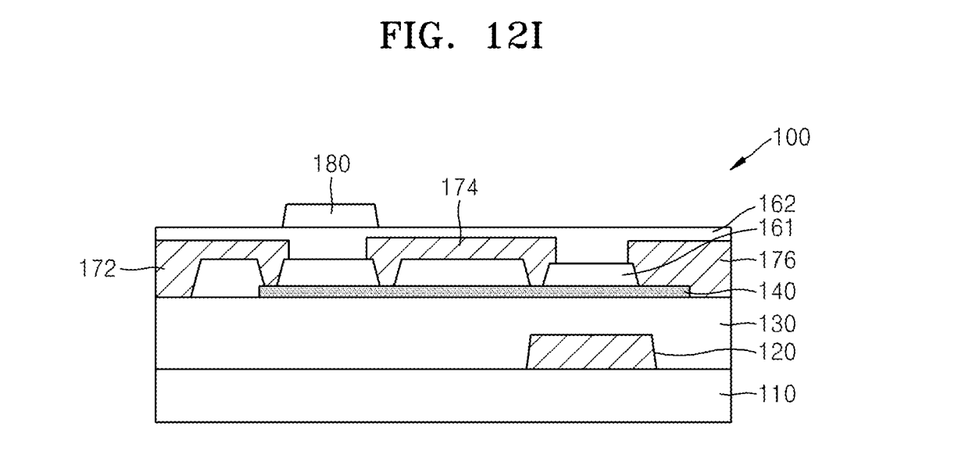

Referring to FIG. 12I, a top gate electrode 180 is formed on the second protection layer 162 between the drain electrode 172 and the intermediate electrode 174.

The top gate electrode 180 may include a high-conductivity metal material, such as Pt, Ru, Au, Ag, Mo, Al, W, or Cu. Alternatively, when the top gate electrode 180 is applied, for example, to a display device, the top gate electrode 180 may be manufactured simultaneously in a pixel electrode forming process. In this case, like the pixel electrode, the top gate electrode 180 may include a transparent electrode material. For example, the top gate electrode 180 may include transparent conductive oxide (TCO). In detail, the top gate electrode 180 may include indium tin oxide (ITO), indium zinc oxide (IZO), aluminum zinc oxide (AZO), ZnO, GZO(ZnO:Ga), $In_2O_3$, $SnO_2$, CdO, $CdSnO_4$, or $Ga_2O_3$.

In example embodiments, a method of manufacturing the transistor 100 of FIG. 3 may also be used to manufacture the transistor 200 of FIG. 10 by controlling the thicknesses of the insulating layer 130 and the protection layer 160.

According to example embodiments, a manufacturing method for controlling the insulation property of a gate insulating layer is provided. Accordingly, a transistor, which has an improved threshold voltage stability due to two transistors having different gate insulating layer structures, may be manufactured.

According to example embodiments, a transistor having an improved threshold voltage stability may be used as a switching device or a driving device in various electronic devices, and may be used, for example, in a display device to implement a display apparatus having a high image quality and an increased lifetime.

Hereinafter, a description will be given of an example in which the transistor is used in a display device.

Figure 13:
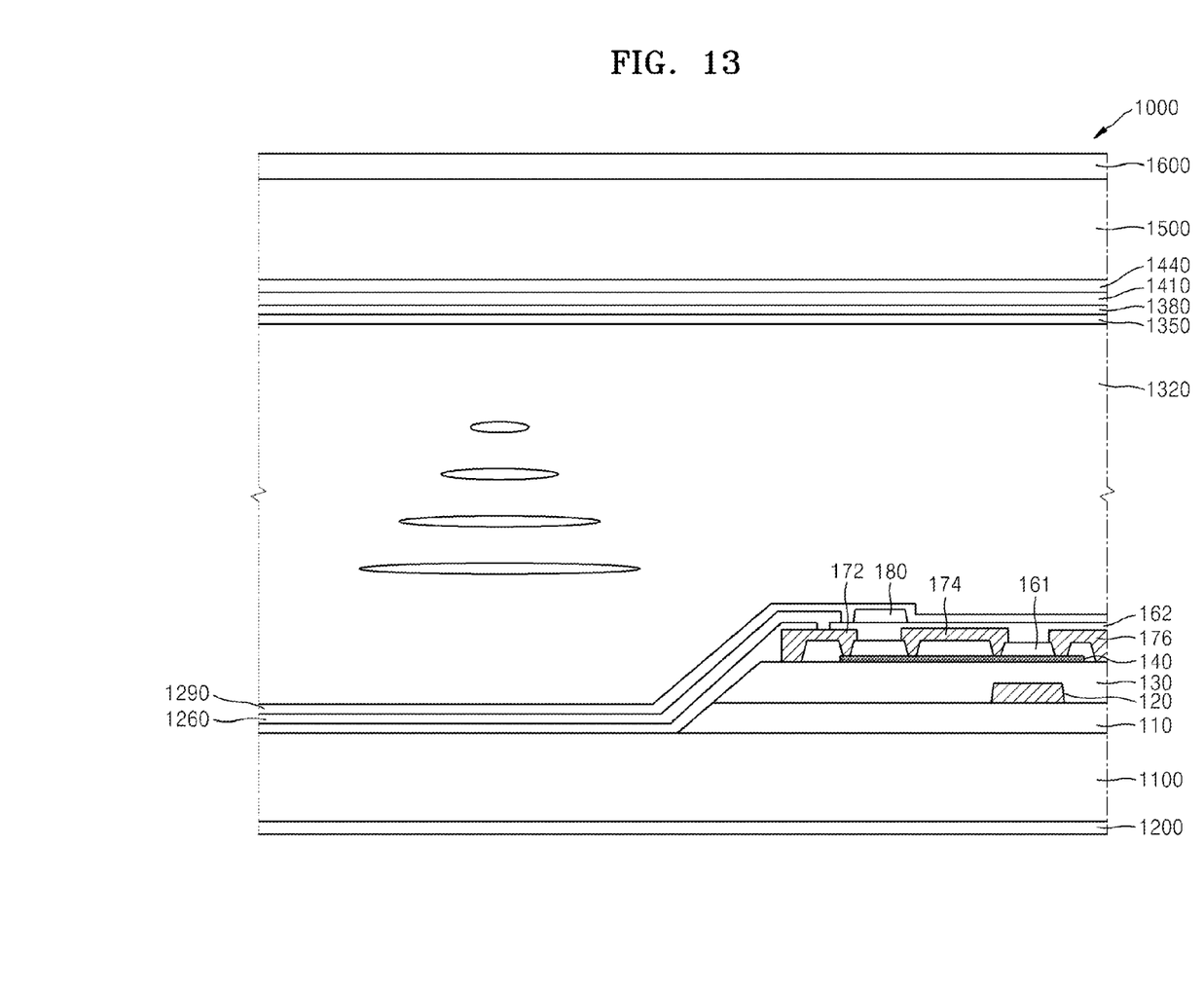
FIG. 13 is a cross-sectional view illustrating a schematic configuration of a liquid crystal display device using a transistor according to example embodiments.

FIG. 13 is a cross-sectional view illustrating a schematic configuration of a liquid crystal display device 1000 using a transistor according to example embodiments.

The liquid crystal display device 1000 includes: a pixel electrode 1260 connected to a drain electrode 172 of a transistor; a common electrode 1380 spaced apart from the pixel electrode 1260; and a liquid crystal layer 1320 disposed between the pixel electrode 1260 and the common electrode 1380.

In FIG. 13, the transistor is illustrated as being the transistor of FIG. 3. However, this is merely a non-limiting example, and the transistor may be the transistor of FIG. 10. Also, only one pixel is illustrated in FIG. 13.

A detailed structure will be described below.

The liquid crystal display device 1000 includes a transparent rear substrate 1100 and a transparent front substrate 1500 that are disposed to face each other, and the liquid crystal layer 1320 is provided between the rear substrate 1100 and the front substrate 1500. A first polarizer 1200 is disposed on an outside surface of the rear substrate 1100, and a second polarizer 1600 is disposed on an outside surface of the front substrate 1500. Also, a first alignment film 1290 and a second alignment film 1350 are disposed respectively under and on the liquid crystal layer 1320 to improve interface characteristics and alignment characteristics. Also, a color filter 1440, a passivation layer 1410, and the common electrode 1380 are sequentially formed under the front substrate 1500.

In response to an output of the transistor controlled according to image information, the pixel electrode 1260 is turned on/off to form an image.

Figure 14:
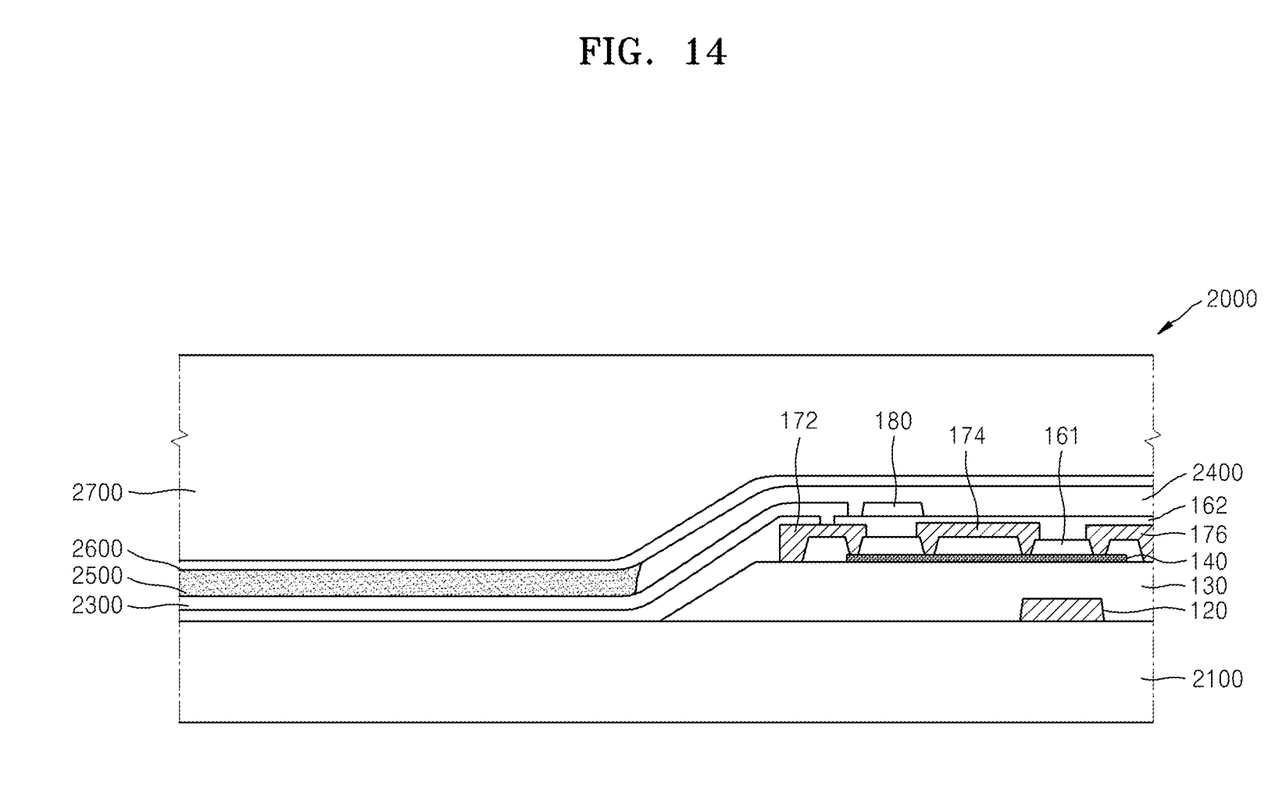
FIG. 14 is a cross-sectional view illustrating a schematic configuration of an organic light-emitting display device using a transistor according to example embodiments.

FIG. 14 is a cross-sectional view illustrating a schematic configuration of an organic light-emitting display device 2000 using a transistor according to example embodiments.

The organic light-emitting display device 2000 includes: a pixel electrode 2300 connected to a drain electrode 172 of a transistor formed on a substrate 2100; a common electrode 2600 spaced apart from the pixel electrode 2300; and an organic emission layer 2500 disposed between the pixel electrode 2300 and the common electrode 2600.

The organic light emitting layer 2500 may include a low-molecular-weight organic material or a high-molecular-weight organic material, and may be formed of a material to a thickness that may generate a desired (and/or alternatively predetermined) color of light, for example, red, green or blue light. Only one pixel is illustrated in FIG. 14. In FIG. 14, the organic light emitting layer 2500 is illustrated as including a single layer. However, this is merely for convenience, and the organic light-emitting layer 2500 may include a plurality of layers including a hole injection layer (HIL), a hole transport layer (HTL), an emission layer (EML), an electron transport layer (ETL), and an electron injection layer (EIL).

Also, a passivation layer 2400 is provided to cover a top gate electrode 180, and a capping layer 2700 is provided on the common electrode 2600. The capping layer 2700 may be formed of a reflective metal or a transparent insulating material according to a display direction, that is, an emission direction of light generated by the organic light-emitting layer 2500.

According to example embodiments, response to an output of the transistor controlled according to image information, the pixel electrode 2300 is turned on/off to form an image.

As described above, according to example embodiments, the liquid crystal display device 1000 and/or the organic light-emitting display device 2000 use a transistor having a high threshold voltage stability, thereby implementing a long lifetime and a high image quality.

It should be understood that example embodiments described herein should be considered in a descriptive sense only and not for purposes of limitation. Descriptions of features or aspects within each TFT, organic light-emitting displayer device, organic light-emitting display device according to example embodiments, and/or methods of manufacturing the same should typically be considered as available for other similar features or aspects in other transistors, light-emitting displayer devices, and/or organic light-emitting display devices according to example embodiments.

While some example embodiments have been described with reference to the drawings, it will be understood by those of ordinary skill in the art that various changes in form and details may be made therein without departing from the spirit and scope of the claims.

What is claimed is:

1. A transistor comprising:
    a first field effect transistor (FET) including a first gate electrode, a first gate insulating film, a channel layer, a drain electrode contacting a first portion of the channel layer, and an intermediate electrode contacting a second portion of the channel layer;
    a second FET connected in series to the first FET, the second FET including a second gate electrode, a second gate insulating film, the channel layer, the intermediate electrode and a source electrode contacting a third portion of the channel layer;
    wherein the first and second gate insulating films have one of different leakage current characteristics and different gate electric field characteristics.

2. The transistor of claim 1, wherein the first gate insulating film is configured to generate a larger leakage current than the second gate insulating film.

3. The transistor of claim 2, wherein an insulating property of the first gate insulating film is a lower than an insulating property of the second gate insulating film.

4. The transistor of claim 2, wherein a porosity of the first gate insulating film is a higher than a porosity of the second gate insulating film.

5. The transistor of claim 2, wherein the second gate insulating film of the second FET is configured to compensate for an off current increase due to a leakage current of the first FET.

6. The transistor of claim 2, wherein the first gate insulating film is formed at a lower temperature than the second gate insulating film.

7. The transistor of claim 1, wherein the first gate insulating film is configured to provide a lower gate electric field than the second gate insulating film.

8. The transistor of claim 7, wherein a gate capacitance of the first FET is lower than a gate capacitance of the second FET.

9. The transistor of claim 7, wherein a thickness of the first gate insulating film is thicker than a thickness of the second gate insulating film.

10. The transistor of claim 7, wherein a dielectric constant of the first gate insulating film is lower than a dielectric constant of the second gate insulating film.

11. The transistor of claim 7, wherein the second gate insulating film of the second FET is configured to compensate for a threshold voltage decrease and a subthreshold slope decrease due to the first gate insulating film.

12. The transistor of claim 11, wherein a thickness of the second gate insulating film is thinner than a thickness of the first gate insulating film.

13. The transistor of claim 11, wherein a dielectric constant of the second gate insulating film is higher than a dielectric constant of the first gate insulating film.

14. The transistor of claim 1, wherein
    one of the first FET and the second FET has a top gate structure, and
    an other of the first FET and the second FET has a bottom gate structure.

15. The transistor of claim 14, wherein
the first FET has a top gate structure, and
the second FET has a bottom gate structure.

16. An electronic device comprising:
the transistor of claim 1.

17. The electronic device of claim 16, wherein
the electronic device is a display device; and
the transistor is one of driving device and a switching device in the electronic device.

18. A transistor comprising:
a bottom gate electrode;
an insulating layer covering the bottom gate electrode;
a channel layer on the insulating layer;
a protection layer on the channel layer, the protection layer patterned to expose a plurality of regions spaced apart from each other on the channel layer;
a drain electrode and a source electrode respectively contacting both end regions among the plurality of regions of the channel layer;
an intermediate electrode contacting an intermediate region among the plurality of regions of the channel layer; and
a top gate electrode on the protection layer between the drain electrode and the intermediate electrode,
wherein the insulating layer and the protection layer respectively function as gate insulating films having one of different leakage current characteristics and gate electric field characteristics with respect to the bottom gate electrode and the top gate electrode.

19. The transistor of claim 18, wherein an insulating property of the protection layer is lower than an insulating property of the insulating layer.

20. The transistor of claim 18, wherein the protection layer comprises:
a first protection layer contacting the channel layer; and
a second protection layer covering the first protection layer, the source electrode, the intermediate electrode, and the drain electrode.

21. The transistor of claim 18, wherein a thickness of the protection layer is thicker than a thickness of the insulating layer.

22. The transistor of claim 18, wherein a dielectric constant of the protection layer is lower than a dielectric constant of the insulating layer.

23. The transistor of claim 18, wherein the channel layer includes one of amorphous silicon, crystalline silicon, semiconductor oxide, and semiconductor nitride.

24. The transistor of claim 23, wherein the semiconductor oxide includes at least one of $In_2O_3$, $Ga_2O_3$, ZnO, $TiO_2$, $Ta_2O_3$, $ZrO_2$, $HfO_2$, and $SnO_2$.

25. The transistor of claim 23, wherein the semiconductor nitride includes one of $Zn_3N_2$-containing ZnON, ZnONF, Ga—ZnON, In—ZnON, Al—ZnON, Ga—ZnONF, In—ZnONF, and Al—ZnONF.

26. The transistor of claim 23, wherein the top gate electrode includes a transparent electrode material.

27. An organic light-emitting display device comprising:
the transistor of claim 18;
a pixel electrode connected to the drain electrode of the transistor;
a common electrode on the pixel electrode; and
an organic emission layer between the pixel electrode and the common electrode.

28. A liquid crystal display device comprising:
the transistor of claim 18;
a pixel electrode connected to the drain electrode of the transistor;
a common electrode on from the pixel electrode; and
a liquid crystal layer between the pixel electrode and the common electrode.

29. A method of manufacturing a transistor, comprising:
forming an insulating layer covering a bottom gate electrode;
forming a channel layer on the insulating layer;
forming a protection layer on the channel layer, the protection layer being patterned to expose a plurality of regions spaced apart from each other on the channel layer,
the protection layer being formed under different deposition conditions than the insulating layer, and
the protection layer and the insulating layer having different leakage current characteristics;
forming a drain electrode, an intermediate electrode, and a source electrode respectively contacting the plurality of regions; and
forming a top gate electrode on the protection layer between the drain electrode and the intermediate electrode, wherein
the insulating layer and the protection layer respectively function as gate insulating films having one of different leakage current characteristics and gate electric field characteristics with respect to the bottom gate electrode and the top gate electrode.

30. The method of claim 29, wherein the forming of the protection layer includes:
forming a first protection layer contacting the channel layer; and
forming a second protection layer to cover the first protection layer, the source electrode, the intermediate electrode, and the drain electrode.

31. The method of claim 29, wherein the protection layer is formed at a lower deposition temperature than a deposition temperature for forming the insulating layer.

32. The method of claim 29, wherein the forming the insulating layer includes forming the insulating layer at a deposition temperature of about 200° C. to about 500° C.

33. The method of claim 29, wherein the forming the protection layer includes forming the protection layer at a deposition temperature of about 150° C. to about 400° C.

34. The method of claim 29, wherein the forming the top gate electrode includes forming the top gate electrode from a transparent electrode material.

\* \* \* \* \*